(12) United States Patent
Joshi et al.

(10) Patent No.: US 8,212,361 B2
(45) Date of Patent: *Jul. 3, 2012

(54) SEMICONDUCTOR DIE PACKAGE INCLUDING MULTIPLE DIES AND A COMMON NODE STRUCTURE

(75) Inventors: Rajeev Joshi, Cupertino, CA (US); Venkat Iyer, Cupertino, CA (US); Jonathan Klein, Palo Alto, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/575,641

(22) Filed: Oct. 8, 2009

(65) Prior Publication Data

US 2010/0090331 A1   Apr. 15, 2010

Related U.S. Application Data

(63) Continuation of application No. 11/410,504, filed on Apr. 24, 2006, now Pat. No. 7,618,896.

(51) Int. Cl.
*H01L 23/48* (2006.01)

(52) U.S. Cl. . 257/773; 257/724; 257/728; 257/E23.143; 257/E23.151; 257/E23.178

(58) Field of Classification Search .................. 257/724, 257/692, 730, 773, 728, 726, 727, E23.143, 257/E23.151, 177, 686, 777, E23.178
See application file for complete search history.

(56) References Cited

U.S. PATENT DOCUMENTS

| | | | |
|---|---|---|---|
| 6,005,776 A * | 12/1999 | Holman et al. | 361/760 |
| 6,133,634 A | 10/2000 | Joshi | |
| 6,212,086 B1 | 4/2001 | Dinh | |
| 6,469,384 B2 | 10/2002 | Joshi | |
| 6,489,678 B1 | 12/2002 | Joshi | |
| 6,566,749 B1 | 5/2003 | Joshi et al. | |
| 6,593,622 B2 | 7/2003 | Kinzer et al. | |
| 6,627,991 B1 | 9/2003 | Joshi | |
| 6,661,082 B1 | 12/2003 | Granada et al. | |
| 6,683,375 B2 | 1/2004 | Joshi et al. | |
| 6,696,321 B2 | 2/2004 | Joshi et al. | |
| 6,720,642 B1 | 4/2004 | Joshi et al. | |

(Continued)

OTHER PUBLICATIONS

Office Action dated Oct. 23, 2009 as received in related Chinese Patent Application No. 200780014849.2, filed Mar. 22, 2007.

(Continued)

*Primary Examiner* — Julio J Maldonado
(74) *Attorney, Agent, or Firm* — Kilpatrick Townsend & Stockton LLP

(57) ABSTRACT

A semiconductor die package capable of being mounted to a motherboard is disclosed. The semiconductor die package includes a substrate, and a first semiconductor die mounted on the substrate, where the first semiconductor die includes a first vertical device comprising a first input region and a first output region at opposite surfaces of the first semiconductor die. The semiconductor die package includes a second semiconductor die mounted on the substrate, where second semiconductor die comprises a second vertical device comprising a second input region and a second output region at opposite surfaces of the second semiconductor die. A substantially planar conductive node clip electrically communicates the first output region in the first semiconductor die and the second input region in the second semiconductor die. The first semiconductor die and the second semiconductor die are between the substrate and the conductive node clip.

12 Claims, 9 Drawing Sheets

U.S. PATENT DOCUMENTS

| | | | |
|---|---|---|---|
| 6,731,003 B2 | 5/2004 | Joshi et al. | |
| 6,740,541 B2 | 5/2004 | Rajeev | |
| 6,753,605 B2 | 6/2004 | Joshi | |
| 6,777,800 B2 | 8/2004 | Madrid et al. | |
| 6,798,044 B2 | 9/2004 | Joshi | |
| 6,806,580 B2 | 10/2004 | Joshi et al. | |
| 6,836,023 B2 | 12/2004 | Joshi et al. | |
| 6,867,481 B2 | 3/2005 | Joshi et al. | |
| 6,891,256 B2 | 5/2005 | Joshi et al. | |
| 6,940,724 B2 | 9/2005 | Divakar et al. | |
| 6,949,410 B2 | 9/2005 | Joshi et al. | |
| 6,953,998 B2 | 10/2005 | Joshi | |
| 6,992,384 B2 | 1/2006 | Joshi | |
| 6,992,385 B2 | 1/2006 | Satou et al. | |
| 7,008,868 B2 | 3/2006 | Joshi | |
| 7,022,548 B2 | 4/2006 | Joshi et al. | |
| 7,029,947 B2 | 4/2006 | Joshi | |
| 7,061,077 B2 | 6/2006 | Joshi | |
| 7,081,666 B2 | 7/2006 | Joshi et al. | |
| 7,397,120 B2 * | 7/2008 | St. Germain et al. | 257/727 |
| 7,615,854 B2 * | 11/2009 | Montgomery | 257/678 |
| 7,618,896 B2 * | 11/2009 | Joshi et al. | 438/728 |
| 2001/0052639 A1 | 12/2001 | Jeon | |
| 2002/0057553 A1 | 5/2002 | Jeon et al. | |
| 2002/0066950 A1 | 6/2002 | Joshi | |
| 2002/0140070 A1 | 10/2002 | Sook Lim | |
| 2002/0175383 A1 | 11/2002 | Kocon | |
| 2003/0011005 A1 | 1/2003 | Joshi | |
| 2003/0011054 A1 | 1/2003 | Jeun et al. | |
| 2003/0014620 A1 | 1/2003 | Hanjani | |
| 2003/0025183 A1 | 2/2003 | Thornton et al. | |
| 2003/0042403 A1 | 3/2003 | Joshi | |
| 2003/0052408 A1 | 3/2003 | Quinones et al. | |
| 2003/0067065 A1 | 4/2003 | Lee et al. | |
| 2003/0075786 A1 | 4/2003 | Joshi et al. | |
| 2003/0085456 A1 | 5/2003 | Lee et al. | |
| 2003/0085464 A1 | 5/2003 | Lang | |
| 2003/0107126 A1 | 6/2003 | Joshi | |
| 2003/0122247 A1 | 7/2003 | Joshi | |
| 2003/0139020 A1 | 7/2003 | Estacio | |
| 2003/0173659 A1 | 9/2003 | Lee et al. | |
| 2003/0178717 A1 | 9/2003 | Singh | |
| 2004/0041242 A1 | 3/2004 | Joshi | |
| 2004/0056364 A1 | 3/2004 | Joshi et al. | |
| 2004/0061221 A1 * | 4/2004 | Schaffer | 257/723 |
| 2004/0063240 A1 | 4/2004 | Madrid et al. | |
| 2004/0125573 A1 | 7/2004 | Joshi et al. | |
| 2004/0130011 A1 | 7/2004 | Estacio et al. | |
| 2004/0137724 A1 | 7/2004 | Joshi et al. | |
| 2004/0159939 A1 | 8/2004 | Joshi | |
| 2004/0164386 A1 | 8/2004 | Joshi | |
| 2004/0201086 A1 | 10/2004 | Joshi | |
| 2004/0232542 A1 | 11/2004 | Madrid | |
| 2005/0001293 A1 | 1/2005 | Estacio et al. | |
| 2005/0051878 A1 | 3/2005 | Granada et al. | |
| 2005/0056918 A1 | 3/2005 | Jeun et al. | |
| 2005/0161785 A1 | 7/2005 | Kawashima et al. | |
| 2005/0167742 A1 | 8/2005 | Challa et al. | |
| 2005/0167848 A1 | 8/2005 | Joshi et al. | |
| 2005/0206010 A1 | 9/2005 | Noquil et al. | |
| 2007/0249092 A1 | 10/2007 | Joshi et al. | |

OTHER PUBLICATIONS

Office Action dated Nov. 17, 2011, issued in Chinese Application No. 200780014849.2.

* cited by examiner

SEMICONDUCTOR DIE PACKAGE INCLUDING MULTIPLE DIES AND A COMMON NODE STRUCTURE

CROSS-REFERENCES TO RELATED APPLICATIONS

This application is a continuation of, and claims priority to, U.S. patent application Ser. No. 11/410,504, filed Apr. 24, 2006, now U.S. Pat. No. 7,618,896, the disclosure of which is herein incorporated by reference in its entirety.

BACKGROUND OF THE INVENTION

Synchronous buck converters are used for voltage regulation. A typical synchronous buck converter can use a controller IC (integrated circuit), a high-side power MOSFET and a low-side power MOSFET.

FIG. 1 shows a simplified circuit diagram of a typical synchronous buck converter. Synchronous buck converter (SBC) 10 includes a high-side metal oxide semiconductor field effect transistor (MOSFET) 12 and a low-side MOSFET 14. The drain D of the low-side MOSFET 14 is electrically connected to the source S of the high-side MOSFET 12, through a node S. A PWM (pulse width modulator) controller can control the gates G of the high and low-side MOSFETs 12, 14.

The node connection between the source S and the drain D of the high and low-side MOSFETs 12 and 14, respectively, in SBC 10, desirably has very low inductance in order for the SBC 10 to be used at moderate to high operating/switching frequencies. Where MOSFETs 12 and 14 are configured as discrete devices, the design of the circuit layout of SBC 10 is desirably optimized to reduce parasitic inductances. Alternatively, SBC 10 can be configured as a fully-integrated synchronous buck converter in a single converter in a single package, which is designed and laid out to reduce parasitic inductances in the connection between the source S and the drain D of the high and low-side MOSFETs 12 and 14, respectively. Such fully integrated devices, however, tend to be fairly application and/or design specific devices that are often not compatible with other applications and/or designs. Further, the printed circuit board traces/conductors that connect the MOSFETs are typically not well-suited to carrying moderate to high levels of current.

In a synchronous buck converter using conventional packages, the high side MOSFET source is connected to a low side MOSFET drain with bond wires. This creates high parasitic inductance. In addition, in conventional packages, the connection of the driver IC to the high side and low side MOSFET gate, source and drain is also performed using bond wires and individual die paddles that support the MOSFETs. Using individual paddles requires the use of longer bond wires. Such factors reduce the high-frequency power efficiency and thermal performance of conventional packages. In general, multi-die paddle packages have a lower package reliability level than embodiments of the invention. Moreover, in general, multi die paddle devices are laterally arranged as a result of which the physical size of the package is larger leading to lower package reliability (e.g. sensitivity to moisture during reflow/soldering/mounting processes). In addition, the conventional package does not dissipate heat well, and it would be desirable to improve the heat dissipation properties of packages of this type.

Accordingly, it would be desirable to provide for improved semiconductor die packages, methods for making semiconductor die packages, and electrical assemblies using such semiconductor die packages.

SUMMARY OF THE INVENTION

Embodiments of the invention are directed to semiconductor die packages, methods for making semiconductor die packages, and electrical assemblies including the semiconductor die packages.

One embodiment of the invention is directed to a semiconductor die package. The semiconductor die package comprises a substrate, and a first semiconductor die mounted on the substrate, where the first semiconductor die comprises a first vertical device comprising a first input region and a first output region at opposite surfaces of the first semiconductor die. The semiconductor die package comprises a second semiconductor die mounted on the substrate, where second semiconductor die comprises a second vertical device comprising a second input region and a second output region at opposite surfaces of the second semiconductor die. A conductive node clip electrically communicates the first output region (e.g., a drain region in a low side MOSFET) in the first semiconductor die and the second input region (e.g., a source region in a high side MOSFET) in the second semiconductor die. The first semiconductor die and the second semiconductor die are between the substrate and the conductive node clip.

Another embodiment of the invention is directed to a method for making a semiconductor die package. The method includes mounting a first semiconductor die to a substrate, where the first semiconductor die comprises a first vertical device comprising a first input region and a first output region at opposite surfaces of the first semiconductor die. The method also includes mounting a second semiconductor die to the substrate, where the second semiconductor die comprises a second vertical device comprising a second input region and a second output region at opposite surfaces of the second semiconductor die. Then, a conductive node clip is attached to the first semiconductor die and the second semiconductor die. The conductive node clip electrically communicates the first output region in the first semiconductor die to the second input region in the second semiconductor die.

Another embodiment of the invention is directed to a method for making a semiconductor die package capable of being mounted to a motherboard, the method comprising: obtaining a first semiconductor die, wherein the first semiconductor die comprises a first vertical device comprising a first input region and a first output region at opposite surfaces of the first semiconductor die; obtaining a second semiconductor, wherein second semiconductor die comprises a second vertical device comprising a second input region and a second output region at opposite surfaces of the second semiconductor die; attaching a conductive node clip to the first semiconductor die and the second semiconductor die, wherein the conductive node clip electrically communicates the first output region in the first semiconductor die to the second input region in the second semiconductor die; attaching the first semiconductor die, the second semiconductor die, and the conductive node clip to a substrate; and performing a molding process, thereby forming a package.

These and other embodiments are described in further detail below.

DETAILED DESCRIPTION

Figure 1:
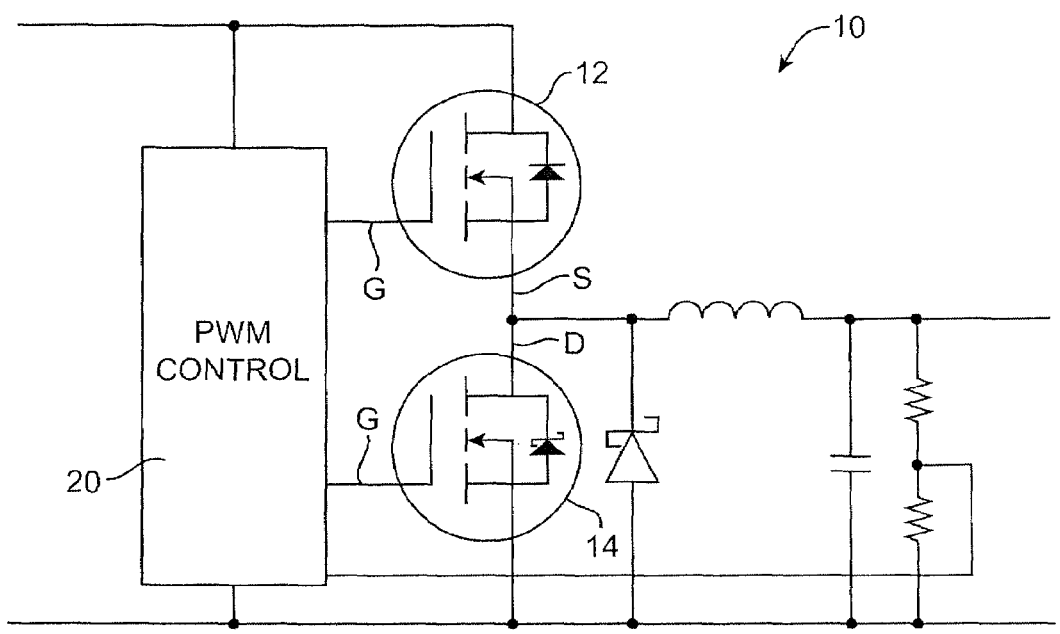
FIG. 1 shows a circuit diagram of a synchronous buck converter circuit.

Embodiments of the invention are directed to semiconductor die packages and methods for making semiconductor die packages. A semiconductor die package according to an embodiment of the invention comprises a substrate, and a first semiconductor die mounted on the substrate, where the first semiconductor die comprises a first vertical device (e.g., a low side MOSFET) comprising a first input region (e.g., a source region) and a first output region (e.g., a drain region) at opposite surfaces of the first semiconductor die. The semiconductor die package comprises a second semiconductor die mounted on the substrate. The second semiconductor die comprises a second vertical device (e.g., a high side MOSFET) comprising a second input region (e.g., a source region) and a second output region (e.g., a drain region) at opposite surfaces of the second semiconductor die. A conductive node clip electrically communicates the first output region in the first semiconductor die and the second input region in the second semiconductor die. The first semiconductor die and the second semiconductor die are between the substrate and the conductive node clip. A molding material may cover at least part of the substrate, the first and second semiconductor dies, and the conductive node clip. The semiconductor die package can be self-contained and is capable of being mounted to a motherboard.

The substrate that is used in the semiconductor die package may have any suitable configuration. In preferred embodiments of the invention, the substrate is in the form of a leadframe structure. The term "leadframe structure" can refer to a structure that is derived from a leadframe. Leadframe structures can be formed by, for example, stamping processes which are known in the art. An exemplary leadframe structure can also be formed by etching a continuous conductive sheet to form a predetermined pattern. Thus, in embodiments of the invention, a leadframe structure in a semiconductor die package may be a continuous metallic structure or a discontinuous metallic structure.

A leadframe structure according to an embodiment of the invention may originally be one of many leadframe structures in an array of leadframe structures that are connected together by tie-bars. During the process of making a semiconductor die package, the leadframe structure array may be cut to separate individual leadframe structures from each other. As a result of this cutting, portions of a leadframe structure (such as a source lead and a gate lead) in a final semiconductor die package may be electrically and mechanically uncoupled from each other. In other embodiments, an array of leadframe structures is not used when manufacturing semiconductor die packages according to embodiments of the invention.

A leadframe structure according to an embodiment of the invention many comprise any suitable material, may have any suitable form, and may have any suitable thickness. Exemplary leadframe structure materials include metals such as copper, aluminum, gold, etc., and alloys thereof. The leadframe structures may also include plated layers such as plated layers of gold, chromium, silver, palladium, nickel, etc.

A leadframe structure according to an embodiment of the invention may also have any suitable configuration. For example, the leadframe structure may also have any suitable thickness including a thickness of less than about 1 mm (e.g., less than about 0.5 mm). In addition, the leadframe structure may have a number of die attach regions which may form die attach paddles (DAP). Leads may extend laterally away from the die attach region. They may also have surfaces that are and/or are not coplanar with the surface forming the die attach region. For example, in some examples, the leads may be bent downwardly with respect to the die attach region.

If the leads of the leadframe structure do not extend laterally outward past the molding material, the substrate can be considered a "leadless" substrate and a package including the substrate could be considered a "leadless" package. If the leads of the leadframe structure extend past the molding material, then the substrate can be a "leaded" substrate and the package may be a "leaded package".

The molding material may comprise any suitable material. Suitable molding materials include biphenyl based materials, and multi-functional cross-linked epoxy resin composite materials. Suitable molding materials are deposited in liquid or semi-solid form on a leadframe structure, and are thereafter cured to harden them.

The first and second semiconductor dies that are mounted on the substrate may include any suitable type of vertical semiconductor device. Vertical devices have at least an input at one side of the die and an output at the other side of the die so that current can flow vertically through the die. Exemplary semiconductor devices are also described in U.S. patent application Ser. No. 11/026,276, filed on Dec. 29, 2004, which is herein incorporated by reference in its entirety for all purposes.

Vertical power transistors include VDMOS transistors and vertical bipolar transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces.

Figure 2A:
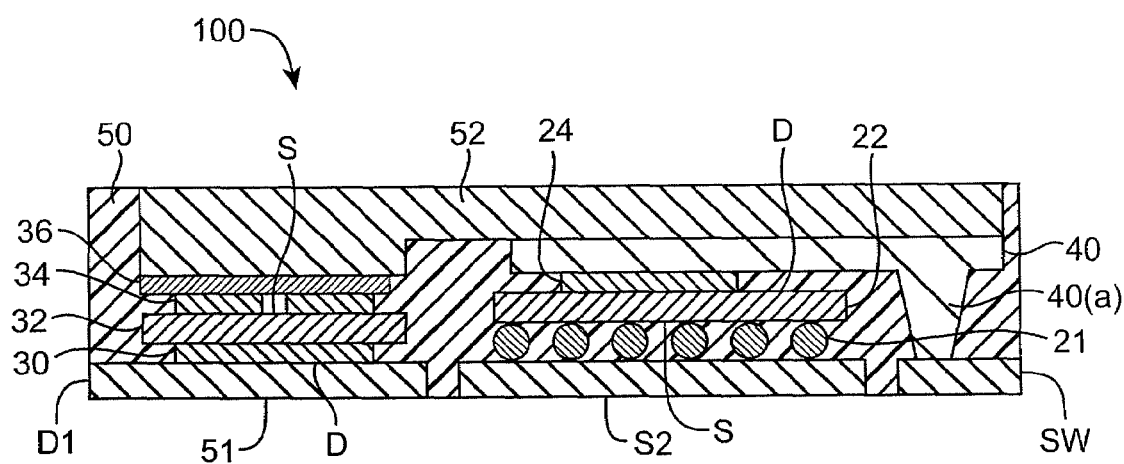
FIG. 2(a) shows a side, cross-sectional view of an embodiment of the invention.

FIG. 2(a) shows a side-cross sectional view of a semiconductor die package 100 according to an embodiment of the invention. The semiconductor die package 100 includes a leadframe structure 51, which includes a drain structure D1, a source structure S2, and a switch node structure SW. Further details regarding the leadframe structure 51 are provided below with respect to FIG. 3.

A first semiconductor die 22 is mounted on the leadframe structure 51. The first semiconductor die 22 may include a first input region at one side of the die 22, and a second output region at the opposite side of the die 22. In this example, the first input region may be a source region S and the output region may be a drain region D. The drain region D is distal to (i.e., away from) the leadframe structure 51 while the source region S is proximate to (i.e., closer to) the leadframe structure 51. The source region S, the drain region D, and a gate region in the first semiconductor die 22 may form a low side MOSFET device. The low side MOSFET device may be used in a synchronous buck converter circuit, or other circuit.

The source region S of the first semiconductor die 22 may be electrically coupled to the source structure S2 of the leadframe structure 51 using solder balls 21. Instead of solder balls 21, solder columns, solder logs, conductive columns, and/or a conductive adhesive can be used instead in other embodiments.

A drain clip 40 is attached to the drain region D in the first semiconductor die 22 via solder 24, or some other conductive material (e.g., a conductive adhesive). The drain clip 21 may have a number of stamped regions 40(a) which may be longer than the thickness of the first semiconductor die 22. The stamped regions 40(a) may be in the form of conductive cones and may electrically connect the drain region D in the first semiconductor die 22 to the switch node structure SW of the leadframe structure 51. The drain clip 40 may be a unitary piece of metal and may be made of a conductive material such as copper.

A second semiconductor die 32 may be mounted to the drain structure D1 of the leadframe structure 51 using solder 30. The drain structure D1 and the source structure S2 may be part of two separate die attach paddles in the leadframe structure 51. The drain region D of the second semiconductor die 32 is proximate to the leadframe structure 51, while the source region S of the second semiconductor die 32 is distal to the leadframe structure 51. The source region S, the drain region D, and a gate region (not shown) in the second semiconductor die 32 may be part of a high side MOSFET device in a synchronous buck converter circuit, or other circuit.

An optional second substrate 36 may be attached to the source region S of the second semiconductor die. As will be explained in further detail below, the second substrate 36 may electrically couple gate and source regions in the second semiconductor die 32 to other portions (not shown) of the leadframe structure 51. It may also electrically couple a conductive node clip 52 to the source region S in the second semiconductor die 32. The second substrate 36 may be a circuitized substrate with two or more conductive and insulating layers, and may route source and gate current to the source region S and a gate region in the second semiconductor die.

The conductive node clip 52 may comprise a conductive material such as copper, aluminum, and alloys thereof. It may have a generally planar configuration. In FIG. 2, the conductive node clip 52 has a stepped structure and is generally planar. The stepped structure provides for a uniformly shaped die package. It may also electrically couple the drain region D of the first semiconductor die 22 and the source region S of the second semiconductor die 32, via solder 24 and solder 34, respectively.

A molding material 50 is molded around the first and second semiconductor dies 22, 32, and an exterior surface of the molding material 50 may be substantially coplanar with an exterior surface of the conductive node clip 52. Suitable molding materials are described above.

In the semiconductor die package 100, exterior surfaces of the molding material 50 may be substantially coplanar with surfaces of the leadframe structure 51 as well as the conductive node clip 52. In this example, the leads of the leadframe structure 51 do not extend past the lateral surfaces of the molding material 50.

To form the semiconductor die package shown in FIG. 2(a), a number of subpackages may be first formed, and these may be mounted to a leadframe structure or the like to form a assembly. The subsequently formed assembly may then be molded and then singulated.

Figure 2B:
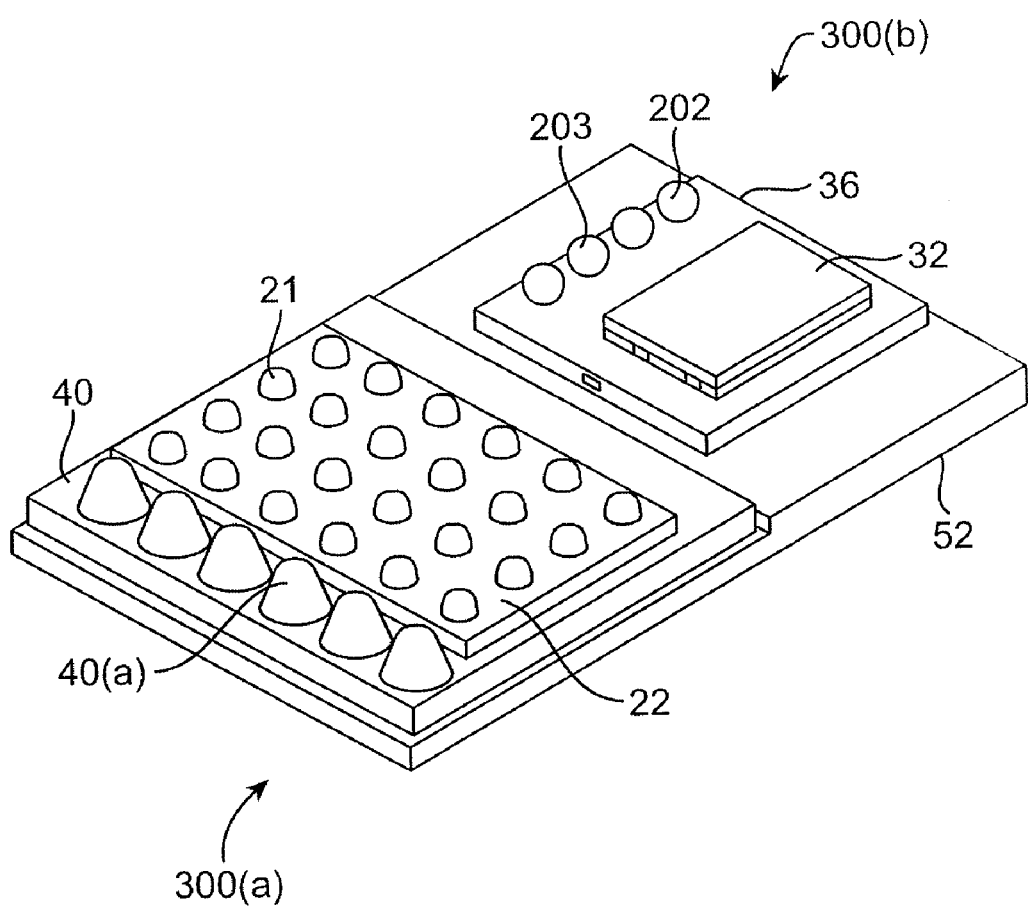
FIG. 2(b) shows two sub-packages including a MOSFET BGA-type package and an unmolded package disposed on a conductive node clip.

Illustratively, FIG. 2(b) shows some parts of the previously described semiconductor die package from a perspective view. In FIGS. 2(a)-2(b), like numerals designate like elements so the descriptions of the elements in FIG. 2(b) need not be repeated here.

FIG. 2(b) shows an assembly which includes two sub-packages 300(a), 300(b). A first sub-package 300(a) may be referred to as a MOSFET BGA (ball grid array) type package, while a second sub-package 300(b) may be referred to as a substrate based unmolded type package. In some embodiments, these sub-packages could be separately formed, and then mounted on the conductive node clip 52. For example, the first sub-package 300(a) including a clip 40 and a solder bumped first semiconductor die 22 attached to the clip 40 may be formed. Before or after this, the second sub-package 300(b) including the second substrate 36, a second semiconductor die 32 mounted on the second substrate 36, and solder 202, 203 attached to the second semiconductor die 32 may be formed. The first and second sub-packages 300(a), 300(b) may then be mounted on the conductive node clip 52 (e.g., with solder or a conductive adhesive). Then, the assembly shown in FIG. 2(b) may be mounted on the leadframe structure 51 shown in FIG. 4 (with or without the bonded controller 110), by flipping the entire assembly over. Then, a molding process may be formed to form a molding material around the sub-packages 300(a), 300(b), and a sawing process may be performed to separate the formed package from other packages. Thus, the package that is shown in FIG. 2(a) may thereafter be produced.

FIGS. 3-8 provide more details regarding various components of packages according to embodiments of the invention. Although the preferred way to form the packages is to form sub-packages as described above, the components of the package may be assembled without forming sub-packages in some instances.

Figure 3:
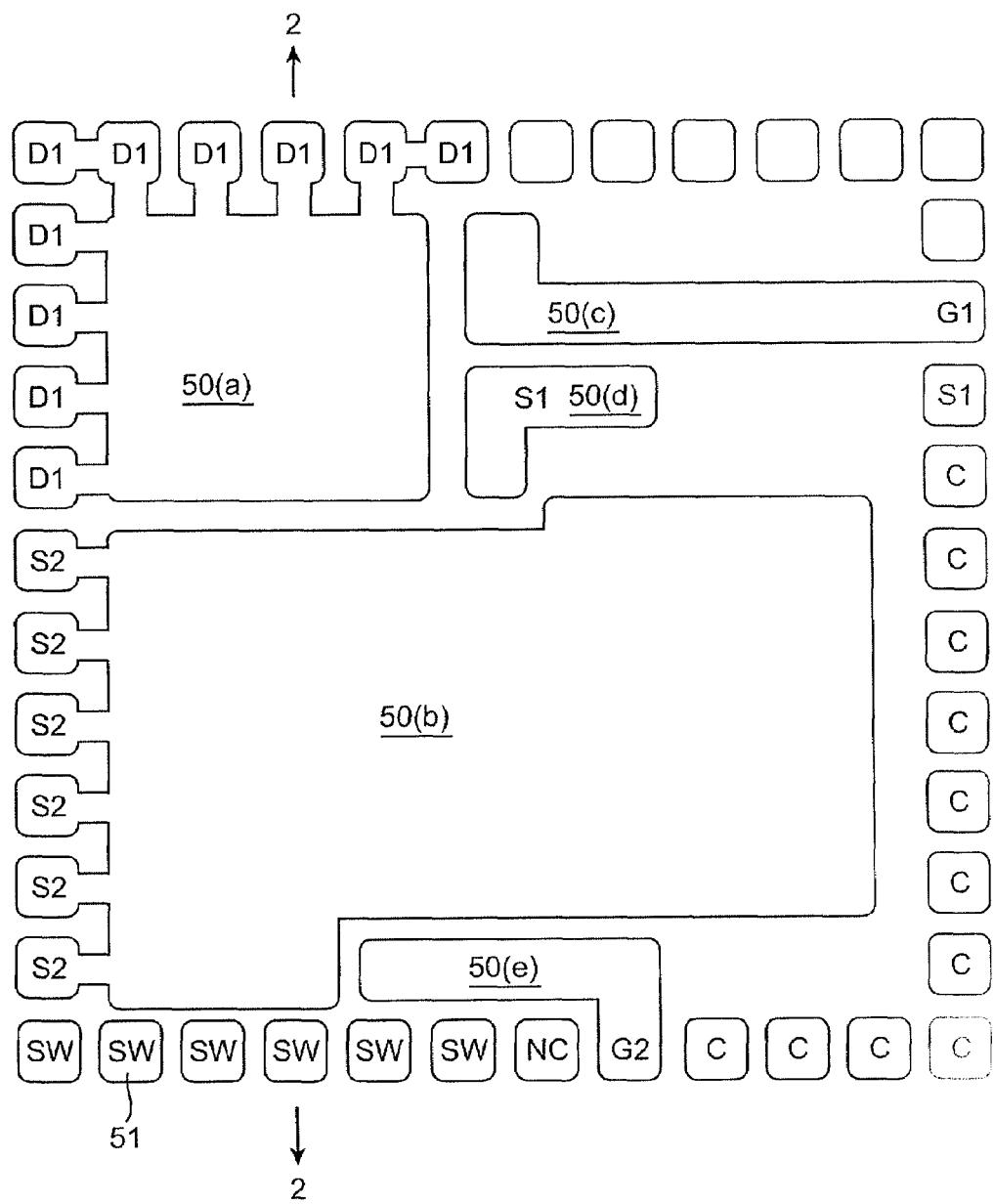
FIG. 3 shows a plan view of a leadframe structure according to an embodiment of the invention.

FIG. 3 shows a top plan view of a leadframe structure 51 according to an embodiment of the invention. The leadframe structure 51 includes a first die attach paddle (DAP) 50(a) for a drain connection to a drain region in a high side MOSFET, and a second DAP 50(b) for a source connection to a source region in a low side MOSFET. Also shown are attach regions 50(c), 50(d), 50(e) which are intended to be respectively coupled to a gate region in the high side MOSFET, a source region in the high side MOSFET, and a gate region in the low side MOSFET. As will be described below, the attach regions 50(c), 50(d), 50(e) may be used for wirebond connections. The line formed by arrows 2-2 may generally correspond to the cross-sectional view shown in FIG. 2(a).

In FIG. 3, a number of leads for inputs and outputs to the formed package are also shown with abbreviations. The abbreviations may be as follows: SW (switch node); S2 (source 2); D1 (drain 1); G1 (gate 1); S1 (source 1); C (controller pin); G2 (gate 2); and NC (no connection).

Figure 4:
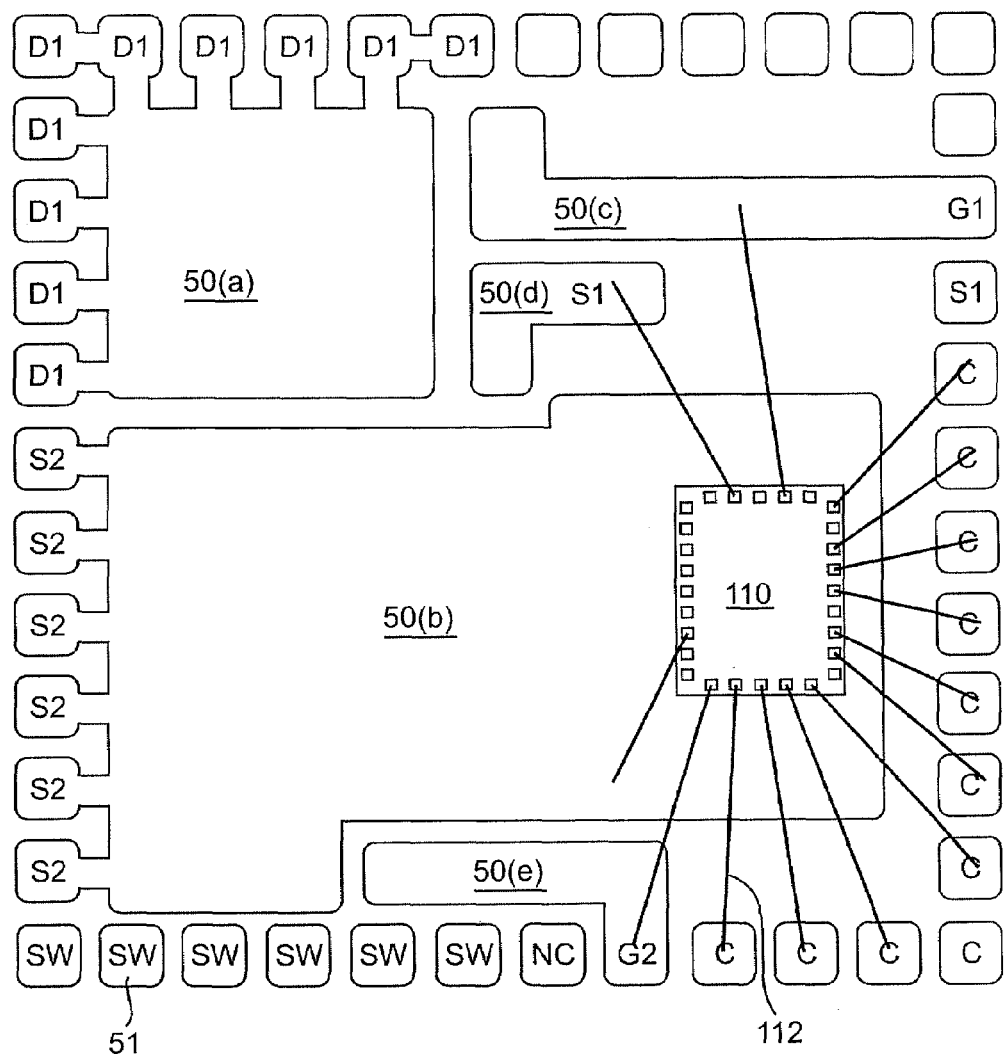
FIG. 4 shows a plan view of a leadframe structure with a controller die mounted on it.

As shown in FIG. 4, a controller die 110 may be mounted on the second DAP 50(b), and will eventually reside alongside the previously described first semiconductor die 22 with the low-side MOSFET. The controller die 110 may be used to control the gates of the low and high side MOSFETs in a synchronous buck converter application. The controller die 110 may be commercially obtained, and may be mounted using any suitable mounting process that is know in the art.

A number of wirebonds 112 may be used to couple the inputs and outputs associated with the controller die 110 with the various attach regions 50(c), 50(d), 50(c) corresponding to G1, S1, and G2, and the leads labeled C. The controller die 110 is preferably mounted on the same DAP as the low side MOSFET to reduce the likelihood of switching interference from the high side MOSFET that will reside on the first DAP 50(a).

Figure 5:
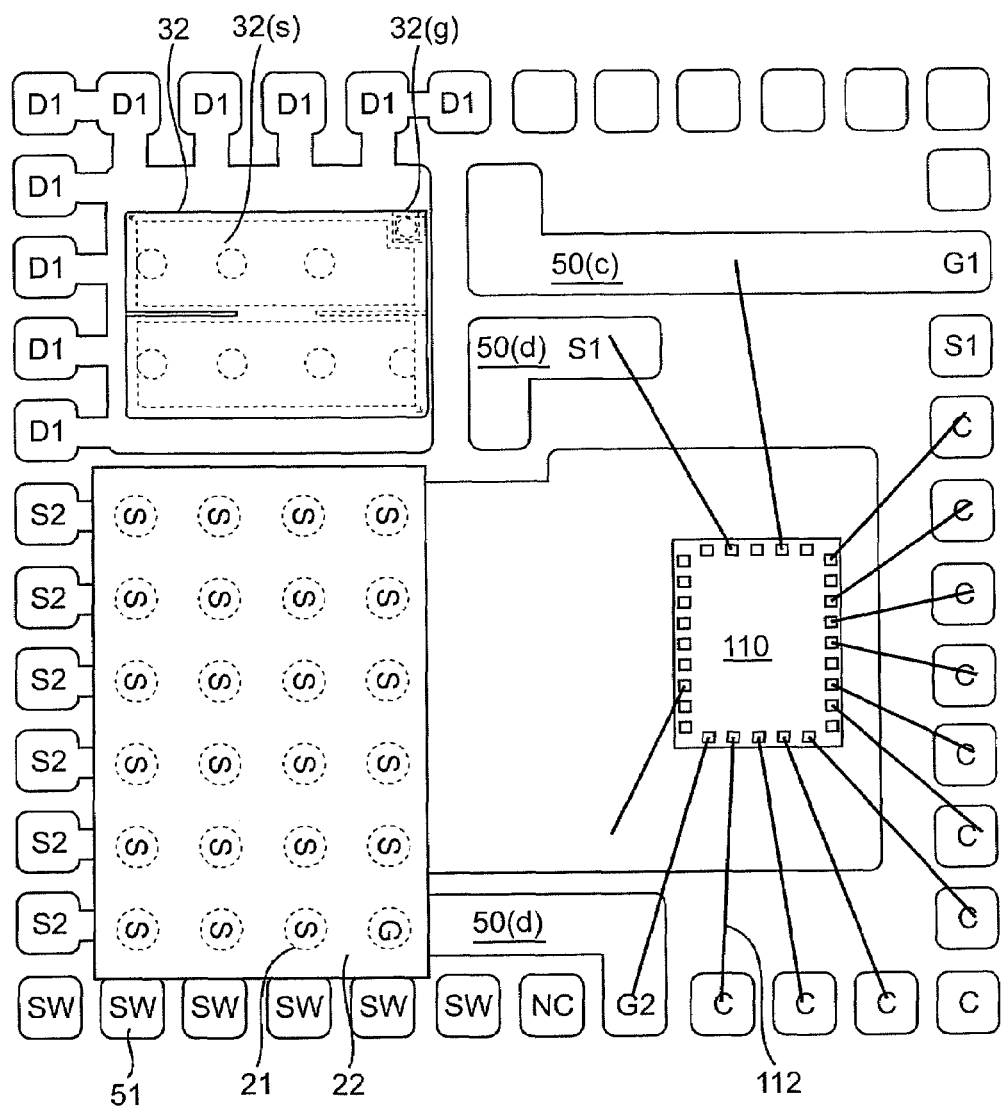
FIG. 5 shows a plan view of a leadframe structure with a controller die, a first semiconductor die comprising a low side MOSFET and a second semiconductor die comprising a high side MOSFET.

As shown in FIG. 5, the first semiconductor die 22 including the low side MOSFET may be mounted to the second DAP 50(b) so that the source region in the first semiconductor die 22 faces towards the second DAP 50(b) and the drain region faces away from the second DAP 50(b). A number of solder balls 21 are shown and these would be between and would serve to connect the second DAP 50(b) and the source region in the first semiconductor die 22. A single solder ball labeled G may be connected to the attach region 50(d), lead G2, and a wirebond leading to the controller die 110.

The second semiconductor die 32 comprising a high side MOSFET (with source region 32(s) and gate region 32(g)) may be mounted on the first DAP 50(a) so that the drain region in the second semiconductor die 32 faces toward the first DAP 50(a), and the source region 32(s) in the second semiconductor die 32 faces away from the first DAP 50(a).

Figure 6:
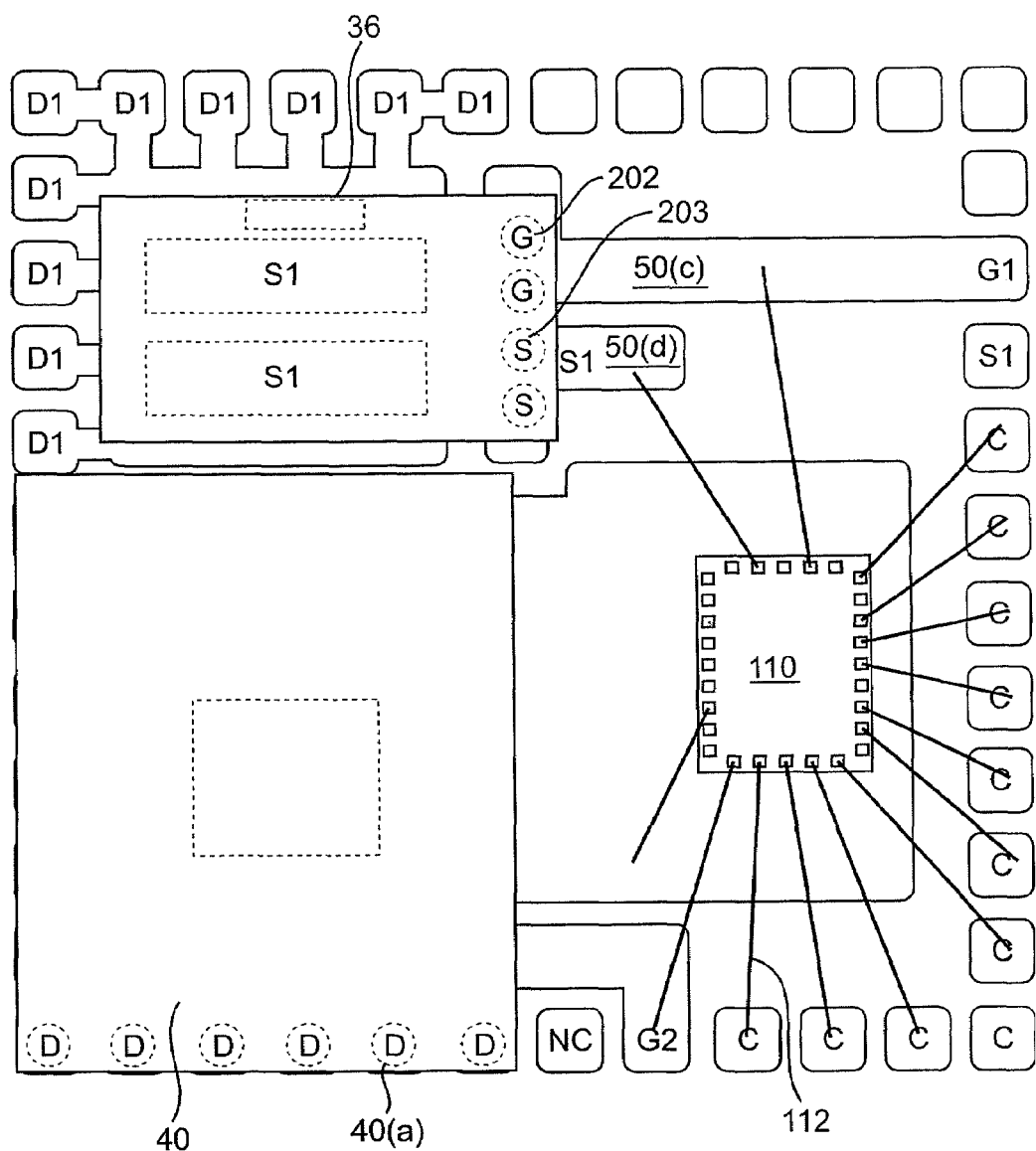
FIG. 6 shows a plan view of a leadframe structure with a controller die, a first semiconductor die comprising a low side MOSFET, and a second semiconductor die comprising a high side MOSFET mounted to the leadframe structure. A second substrate and a drain clip are also shown in FIG. 6.

As shown in FIG. 6, a second substrate 36 may be present and/or mounted on the previously described second semiconductor die 32. The second substrate 36 may include circuitry that connects one or more gate regions in the high side MOSFET in the second semiconductor die 32 to the attach region 50(c) and labeled G1, and one or more source regions in the high side MOSFET to the die attach region 50(d) and labeled S1. Solder balls 203 may also connect the circuitry in the second substrate 36 to the attach region 50(d), while solder balls 202 may connect the circuitry in the second substrate 36 to the attach region 50(c). The second substrate 36 may also provide a connection between a source region in the second semiconductor die 32 and an overlying conductive node clip (not shown).

A conductive clip 40 is shown as being disposed over the first semiconductor die 22, and provide an electrical connection between the drain region in the low side MOSFET in the first semiconductor die 22 and the previously described switch node (SW) leads. Elongated conductive stamped regions 40(a) may provide vertical conductive paths from a planar portion of the conductive clip 40 to the switch node (SW) leads via solder joints. The stamped regions 40(a) may be longer than the thickness of the first semiconductor die 22.

Figure 7:
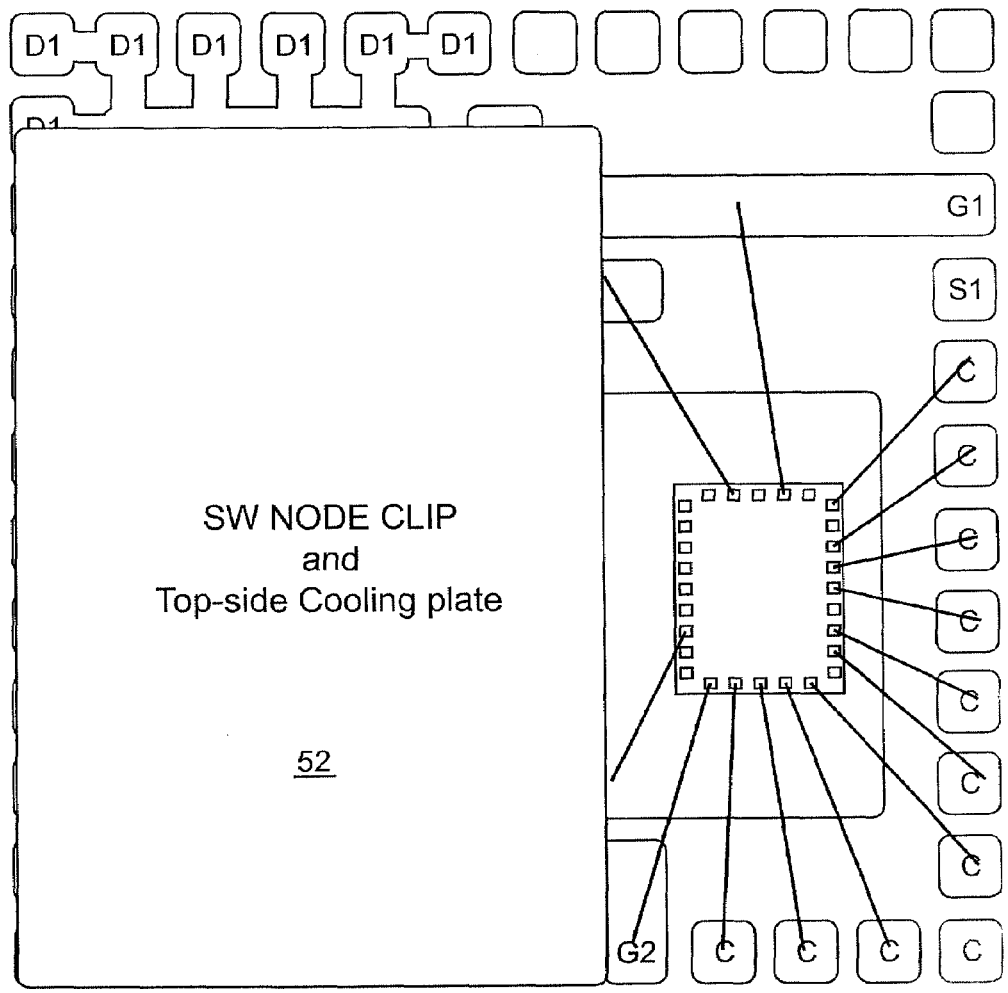
FIG. 7 shows the embodiment shown in FIG. 6, with a conductive node clip attached to the second substrate and the drain clip, and consequently, to the first and second semiconductor dies.

As shown in FIG. 7, a conductive switch node clip 52 may serve to connect the drain region in the low side MOSFET in the first semiconductor die 22 and the source region in the high side MOSFET in the second semiconductor die 32. The conductive node clip can be made of any suitable conductive material including copper, aluminum, or alloys thereof.

Figure 8:
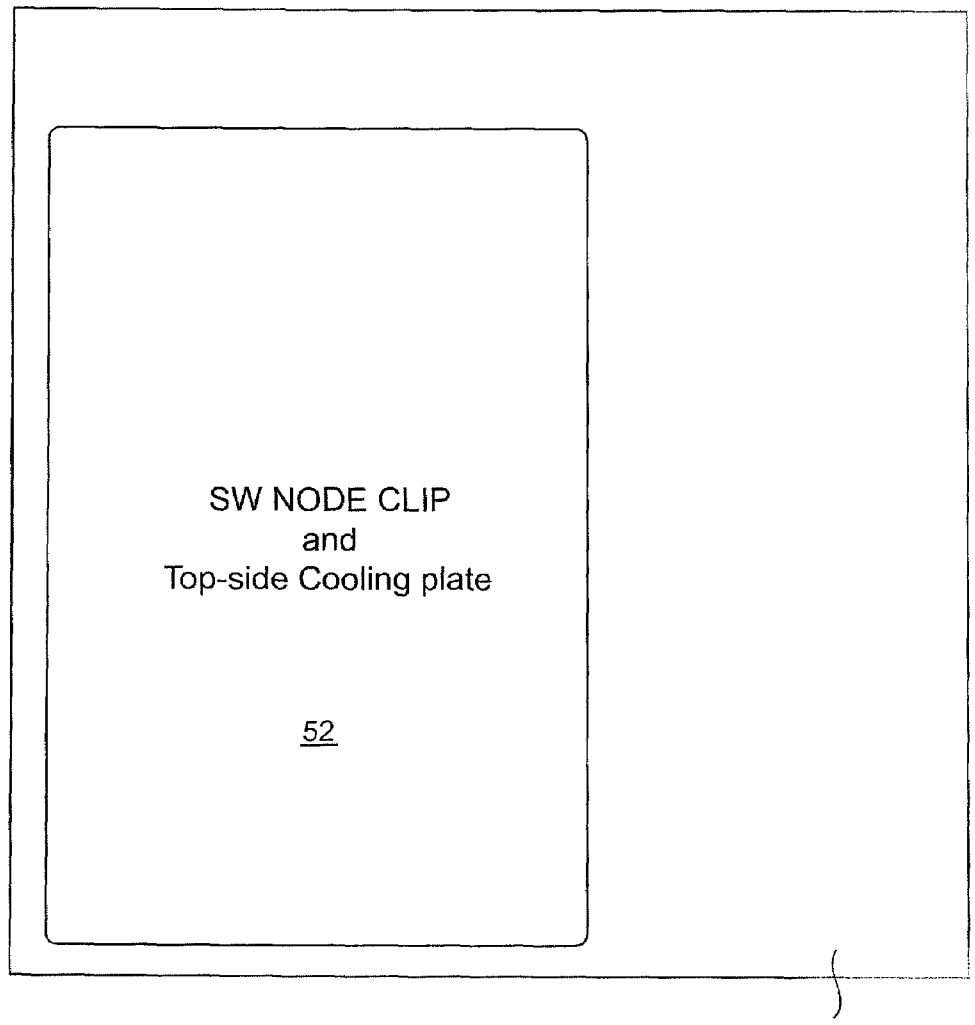
FIG. 8 shows a top plan view of a molded semiconductor die package according to an embodiment of the invention.

As shown in FIG. 8, a molding material 50 is molded around the lateral edges of the switch node clip 52. Since the switch node clip 52 is on top, it provides for improved cooling in the formed semiconductor die package.

The semiconductor die packages according to embodiments of the invention can be incorporated into any suitable electrical assembly. Examples of electrical assemblies include cellular phones, personal and laptop computers, server computers, television sets, etc.

Embodiments of the invention have a number of advantages. First, referring to FIG. 2(a), in embodiments of the invention, cooling can occur from the top of the package 100 through the switch node clip 52 and from the bottom through the leadframe structure 51. Second, in embodiments of the invention, the switch node connection (switch node clip 52) is contained in the package and does not rely on a motherboard. Third, a controller die, a high side MOSFET and a low side MOSFET may be contained in a single package thereby providing for a compact component for a synchronous buck converter. Fourth, since the switch node is inside of the package, this minimizes the loop length for connection between the high side source and the low side drain, thus reducing parasitic inductance in the power path. There are also fewer wirebonds thereby reducing the package's inductance and resistance. All of these characteristics allow for higher switching frequencies and higher power density. Fifth, the formed package may have a micro-leadframe (MLP) type configuration and can be mounted to a motherboard in a conventional manner. Special mounting processes are not needed.

Any of the above-described embodiments and/or any features thereof may be combined with any other embodiment(s) and/or feature(s) without departing from the scope of the invention.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

Any reference to positions such as "top", "bottom", "upper", "lower", etc. refer to the Figures and are used for ease of illustration and are not intended to be limiting. They are not intended to refer to absolute positions.

A recitation of "a", "an" or "the" is intended to mean "one or more" unless specifically indicated to the contrary.

All patents, patent applications, publications, and descriptions mentioned above are herein incorporated by reference in their entirety for all purposes. None is admitted to be prior art.

What is claimed is:

1. A semiconductor die package comprising:
   a substrate;
   a first semiconductor die mounted on the substrate, wherein the first semiconductor die comprises a first input region and a first output region at opposite surfaces of the first semiconductor die;
   a second semiconductor die mounted on the substrate, wherein second semiconductor die comprises a second input region and a second output region at opposite surfaces of the second semiconductor die;
   a first clip electrically connected to the first output region in the first semiconductor die; and
   a conductive node clip electrically communicating the first clip to the second input region in the second semiconductor die, wherein the first semiconductor die and the second semiconductor die are between the substrate and the conductive node clip.

2. The semiconductor die package of claim 1 wherein the substrate is a leadframe structure.

3. The semiconductor die package of claim 1, wherein the substrate includes a switch node structure, and the first clip is electrically connected to the switch node structure.

4. The semiconductor die package of claim 3, further comprising a molding material, wherein the molding material covers the first semiconductor die and the second semiconductor die, and wherein the switch node structure is exposed through the molding material.

5. The semiconductor die package of claim 1 wherein the first semiconductor die comprises a low side MOSFET and the second semiconductor die comprises a high side MOSFET, and wherein the first and second input regions are source regions and the first and second output regions are drain regions.

6. The semiconductor die package of claim 1 further comprising a molding material, wherein the molding material covers the first semiconductor die and the second semiconductor die, and wherein the conductive node clip is exposed through the molding material and has a surface that is substantially coplanar with an external surface of the molding material.

7. The semiconductor die package of claim 1 further comprising a plurality of solder balls electrically coupling the first input region to the substrate.

8. The semiconductor die package of claim 1 further comprising a second substrate between the second semiconductor die and the conductive node clip.

9. The semiconductor die package of claim 1, wherein the conductive node clip has a step structure.

10. An electrical assembly comprising the semiconductor die package of claim 1.

11. The semiconductor die package of claim 1 further comprising solder or conductive adhesive coupling the first clip to the conductive node clip.

12. A semiconductor die package comprising:
a substrate;
a first semiconductor die mounted on the substrate, wherein the first semiconductor die comprises a first input region and a first output region at opposite surfaces of the first semiconductor die;
a second semiconductor die mounted on the substrate, wherein second semiconductor die comprises a second input region and a second output region at opposite surfaces of the second semiconductor die;
a first clip electrically connected to the first output region in the first semiconductor die; and
a conductive node clip electrically communicating the first clip to the second input region in the second semiconductor die, wherein the first clip includes a plurality of stamped regions, wherein each stamped region in the plurality of stamped regions is in the form of a conductive cone.

* * * * *